(12) United States Patent
Gamet et al.

(10) Patent No.: US 11,296,653 B2
(45) Date of Patent: Apr. 5, 2022

(54) MICROCONTROLLER COMPRISING OSCILLATORS THAT ARE CONFIGURED TO RECEIVE EXTERNAL RESONATOR SIGNALS

(71) Applicant: STMicroelectronics (Rousset) SAS, Rousset (FR)

(72) Inventors: Arnaud Gamet, Pourrieres (FR); Philippe Le Fevre, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 17/161,855

(22) Filed: Jan. 29, 2021

(65) Prior Publication Data

US 2021/0242834 A1 Aug. 5, 2021

(30) Foreign Application Priority Data

Jan. 31, 2020 (FR) ...................................... 2000993

(51) Int. Cl.
| | |
|---|---|
| *H03B 5/36* | (2006.01) |
| *H03B 5/14* | (2006.01) |
| *H03B 5/32* | (2006.01) |
| *H03L 1/02* | (2006.01) |
| *G01K 7/32* | (2006.01) |

(52) U.S. Cl.
CPC ................. *H03B 5/36* (2013.01); *G01K 7/32* (2013.01); *H03B 5/14* (2013.01); *H03B 5/32* (2013.01); *H03L 1/026* (2013.01)

(58) Field of Classification Search
CPC ... H03B 5/36; H03B 5/32; H03B 5/14; H03K 19/0175; H03L 1/026; G01K 7/32
USPC ....... 713/300, 500; 331/108 D, 158, 116 FE, 331/108 C, 2, 46
See application file for complete search history.

(56) References Cited

U.S. PATENT DOCUMENTS

| | | | |
|---|---|---|---|
| 6,415,348 B1 | 7/2002 | Mergard et al. | |
| 2006/0005054 A1* | 1/2006 | Fernald | ................. G06F 1/3203 713/300 |
| 2008/0080648 A1 | 4/2008 | Leung et al. | |

OTHER PUBLICATIONS

INPI Search Report and Written Opinion for FR 2000993 dated Oct. 28, 2020 (9 pages).

* cited by examiner

*Primary Examiner* — Arnold M Kinkead
(74) *Attorney, Agent, or Firm* — Crowe & Dunlevy

(57) ABSTRACT

A shared pair of input/output cells configured to be able to be connected to a first external resonator or a second external resonator. A first oscillator and a second oscillator are coupled to the shared pair input/output cells by a switching circuit. The switching circuit is configured to be able to connect either the first oscillator or the second oscillator to the pair of input/output cells.

25 Claims, 3 Drawing Sheets

MICROCONTROLLER COMPRISING OSCILLATORS THAT ARE CONFIGURED TO RECEIVE EXTERNAL RESONATOR SIGNALS

PRIORITY CLAIM

This application claims the priority benefit of French Application for Patent No. 2000993, filed on Jan. 31, 2020, the content of which is hereby incorporated by reference in its entirety to the maximum extent allowable by law.

TECHNICAL FIELD

Embodiments relate to microcontrollers and, in particular, to microcontrollers comprising oscillators that are configured to receive external resonator signals.

BACKGROUND

Microcontrollers comprising a plurality or pairs of input/output cells that are configured to be connected to external resonators are known. In particular, each of these pairs of input/output cells is configured to be connected to a single external resonator. These microcontrollers also comprise oscillators that are connected to these pairs of input/output cells. In particular, each oscillator is connected to a single pair of input/output cells to receive a signal transmitted by the external resonator that is connected to this pair of input/output cells.

More particularly, these microcontrollers comprise a high-frequency oscillator and a low-frequency oscillator. The high-frequency oscillator is connected to a first pair of input/output cells that is configured to be connected to a high-frequency external resonator. The low-frequency oscillator is connected to a second pair of input/output cells that is configured to be connected to a low-frequency external resonator.

Such microcontrollers need to assign two pairs of input/output cells for the operation of the high-frequency oscillator and of the low-frequency oscillator. In addition, these two oscillators are not always used by the end user, who prefers to choose only one of the two.

Meanwhile, there is a need in certain applications to decrease the number of input/output cells of the microcontroller. This decrease in the number of input/output cells may lead to the user using resonators internal to the microcontroller, which may be less accurate than external resonators.

There is therefore a need to provide a microcontroller that is configured to use two oscillators from two external resonators while decreasing the number of input/output cells that are assigned for the operation of these two oscillators.

In addition, by using a microcontroller of the prior art, the user is generally limited in their choices for the design of a circuit board comprising the microcontroller and each external resonator. In particular, their design choices are limited by the site locations of the pairs of input/output cells that are configured to be connected to the external resonators.

There is therefore also a need to provide a microcontroller which makes it possible to offer greater flexibility in the choices for the design of a circuit board comprising the microcontroller and external resonators that are connected to this microcontroller.

SUMMARY

According to one aspect, a microcontroller comprises: at least one pair of input/output cells that are configured to be able to be connected to a first external resonator; a first oscillator and a second oscillator; and wherein at least one pair, referred to as a shared pair, from among said at least one pair of input/output cells is also configured to be able to be connected to a second external resonator, the microcontroller further comprising a switching circuit between said shared pair of input/output cells and the first and second oscillators, the switching circuit being configured to be able to connect either the first oscillator or the second oscillator to the shared pair of input/output cells.

Such a microcontroller allows an end user to use the same pair of input/output cells to advantageously use two external resonators.

Such a microcontroller also makes it possible to decrease the number of input/output cells dedicated to the use of the oscillators. Specifically, such a microcontroller allows a pair of input/output cells to be shared for the use of two oscillators.

In particular, in the microcontrollers of the prior art, the use of two oscillators requires two pairs of input/output cells to be assigned for the operation of the two oscillators. A microcontroller according to embodiments herein therefore makes it possible to decrease the number of input/output cells dedicated to the use of the oscillators with respect to these known microcontrollers. Such a microcontroller therefore makes it possible to free up two input/output cells. These two freed up input/output cells may then be dedicated to another use.

Preferably, the microcontroller comprises a plurality of shared pairs of input/output cells.

Specifically, the user may choose the pair of input/output cells to which to connect a resonator according to a desired location for resonators on a circuit board comprising the microcontroller.

Such a microcontroller therefore makes it possible to offer greater flexibility in the choices for the design of a circuit board comprising this microcontroller and the external resonators.

Furthermore, preferably, the microcontroller comprises a control unit configured to control the switching circuit in order to connect either the first oscillator or the second oscillator to the pair of input/output cells.

In one advantageous embodiment, each shared pair of input/output cells comprises: a first cell used as output to the first resonator and the second resonator; and a second cell used as input for the first resonator and the second resonator.

In one advantageous embodiment, for each shared pair of input/output cells, the switching circuit comprises paths, referred to as first primary paths, configured for: electrically connecting an input of the first oscillator to a first input of the second cell of this shared pair; electrically connecting an output of the first oscillator to a first output of the first cell of this shared pair; and wherein each first primary path comprises a switch between the first oscillator and the cell to which this first primary path is connected.

The switches of the first primary paths that are connected to the same shared pair of input/output cells may be controlled to a closed state in which they allow the first oscillator to be electrically connected to this same shared pair of input/output cells.

The switches of the first primary paths that are connected to the same shared pair of input/output cells may be controlled to an open state in which they allow the first oscillator to be electrically disconnected from this same shared pair of input/output cells.

In particular, the control unit may be configured to control the switch of each first primary path that is connected to the same shared pair of input/output cells to a closed state so as to be able to electrically connect the first oscillator to a first external resonator that is connected to this shared pair of input/output cells.

The control unit may also be configured to control the switch of each first primary path that is connected to the same shared pair of input/output cells to an open state so as to disconnect the first oscillator from the first external resonator that is connected to this shared pair of input/output cells.

In one advantageous embodiment, for each shared pair of input/output cells, the switching circuit further comprises paths, referred to as second primary paths, for: electrically connecting an input of the second oscillator to a second input of the second cell of this shared pair; electrically connecting an output of the second oscillator to a second output of the first cell of this shared pair; and wherein each second primary path comprises a switch between the second oscillator and the cell to which this second primary path is connected.

The switches of the second primary paths that are connected to the same shared pair of input/output cells may be controlled to a closed state in which they allow the second oscillator to be electrically connected to this same shared pair of input/output cells.

The switches of the first primary paths that are connected to the same shared pair of input/output cells may be controlled to an open state in which they allow the second oscillator to be electrically disconnected from this same shared pair of input/output cells.

In particular, the control unit may be configured to control the switch of each second primary path that is connected to the same shared pair of input/output cells to a closed state so as to be able to electrically connect the second oscillator to a second external resonator that is connected to this shared pair of input/output cells.

In addition, the control unit may be configured to control the switch of each second primary path that is connected to the same shared pair of input/output cells to an open state so as to disconnect the second oscillator from the second external resonator that is connected to this shared pair of input/output cells.

The control unit may be configured to control the switches to a closed state either for the first primary paths or for the second primary paths.

In particular, the control unit may be configured such that when the switch of each second primary path is controlled so as to be in an open state, the switch of each first primary path is controlled so as to be in a closed state. In addition, the control unit may be configured such that when the switch of each first primary path is controlled so as to be in an open state, the switch of each second primary path is controlled so as to be in a closed state.

In one advantageous embodiment, for each shared pair of input/output cells, the switching circuit further comprises paths, referred to as first secondary paths, configured for: electrically connecting the output of the first oscillator to the second output of the first cell of this shared pair; electrically connecting the input of the first oscillator to the second input of the second cell of this shared pair; and wherein each first secondary path comprises a switch between the first oscillator and the cell to which this first secondary path is connected.

The first secondary paths make it possible to allow an end user to choose over which input/output of a pair of input/output cells to connect an external resonator with the first oscillator.

The switches of the first secondary paths that are connected to the same shared pair of input/output cells may be controlled to a closed state in which they allow the first oscillator to be electrically connected to this same shared pair of input/output cells.

The switches of the first secondary paths that are connected to the same shared pair of input/output cells may be controlled to an open state in which they allow the first oscillator to be electrically disconnected from this same shared pair of input/output cells.

In particular, the control unit may be configured to control the switch of each first secondary path that is connected to the same shared pair of input/output cells to a closed state so as to be able to electrically connect the first oscillator to the second external resonator that is connected to this shared pair of input/output cells.

The control unit may also be configured to control the switch of each first secondary path that is connected to the same shared pair of input/output cells to an open state so as to disconnect the first oscillator from the second external resonator that is connected to this shared pair of input/output cells.

In particular, the control unit may be configured such that when the switch of each first secondary path is controlled so as to be in an open state, the switch of each first and second primary path is controlled so as to be in a closed state.

In addition, the control unit may be configured such that when the switch of each first primary path or of each second primary path is controlled so as to be in an open state, the switch of each first secondary path is controlled so as to be in a closed state.

In one advantageous embodiment, for each shared pair of input/output cells, the switching circuit further comprises paths, referred to as first compensation paths, which connect each first secondary path to the first oscillator from a node arranged between the switch of this first secondary path and the input/output cell to which this first secondary path is connected, so as to form a feedback loop.

In one advantageous embodiment, for each shared pair of input/output cells, the switching circuit further comprises paths, referred to as second secondary paths, configured for: electrically connecting the output of the second oscillator to the first output of the first cell; electrically connecting the input of the second oscillator to the first input of the second cell; and wherein each second secondary path comprises a switch between the second oscillator and the cell to which this second secondary path is connected.

The second secondary paths make it possible to allow an end user to choose over which input/output of a pair of input/output cells to connect an external resonator with the second oscillator.

The switches of the second secondary paths that are connected to the same shared pair of input/output cells may be controlled to a closed state in which they allow the first oscillator to be electrically connected to this same shared pair of input/output cells.

The switches of the second secondary paths that are connected to the same shared pair of input/output cells may be controlled to an open state in which they allow the first oscillator to be electrically disconnected from this same shared pair of input/output cells.

In particular, the control unit may be configured to control the switch of each second secondary path that is connected to the same shared pair of input/output cells to a closed state so as to be able to electrically connect the second oscillator to the first external resonator that is connected to this shared pair of input/output cells.

The control unit may also be configured to control the switch of each second secondary path that is connected to the same shared pair of input/output cells to an open state so as to disconnect the second oscillator from the first external resonator that is connected to this shared pair of input/output cells.

The control unit may be configured to control the switches of the first primary paths, the switches of the second primary paths, the switches of the first secondary paths or the switches of the second secondary paths to a closed state.

In particular, the control unit may be configured such that when the switch of each second secondary path is controlled so as to be in an open state, the switches of each first and second primary path and of each first secondary path are controlled so as to be in a closed state.

In addition, the control unit may be configured such that when the switch of each first primary path, of each second primary path or of each first secondary path is controlled so as to be in an open state, the switch of each second secondary path is controlled so as to be in a closed state.

In one advantageous embodiment, for each shared pair of input/output cells, the switching circuit further comprises paths, referred to as second compensation paths, which connect each second secondary path to the second oscillator from a node arranged between the switch of this second secondary path and the input/output cell to which this second secondary path is connected, so as to form a feedback loop.

Each oscillator is configured to deliver an oscillating signal exhibiting a given frequency on the basis of a signal transmitted by a resonator operating at said given frequency.

In one advantageous embodiment, the first oscillator is configured to receive an oscillating signal having a frequency of about 32 kHz. The first oscillator is then a low-frequency oscillator.

In one advantageous embodiment, the second oscillator is configured to receive an oscillating signal having a frequency between 4 MHz and 50 MHz. The second oscillator is then a high-frequency oscillator.

In one advantageous embodiment, the switching circuit is configured to be able to withstand a voltage of 5 V.

According to another aspect, what is proposed is a circuit board comprising: a microcontroller such as described above; and an external resonator connected to a shared pair of input/output cells of the microcontroller.

BRIEF DESCRIPTION OF THE DRAWINGS

Other advantages and features of the invention will become apparent upon examining the detailed description of completely non-limiting embodiments and the appended drawings, in which.

DETAILED DESCRIPTION

Figure 1:
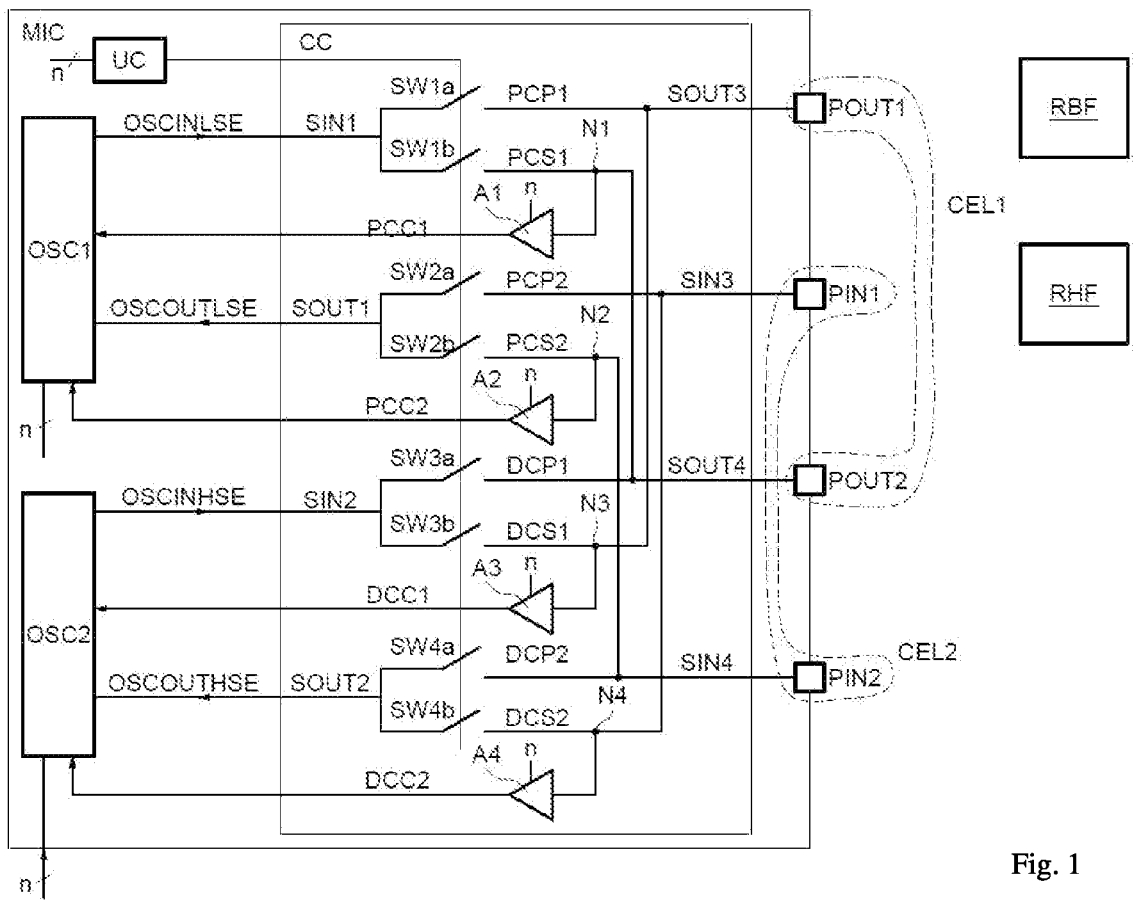
FIG. 1 shows an embodiment of a microcontroller comprising two oscillators.
Figure 2:
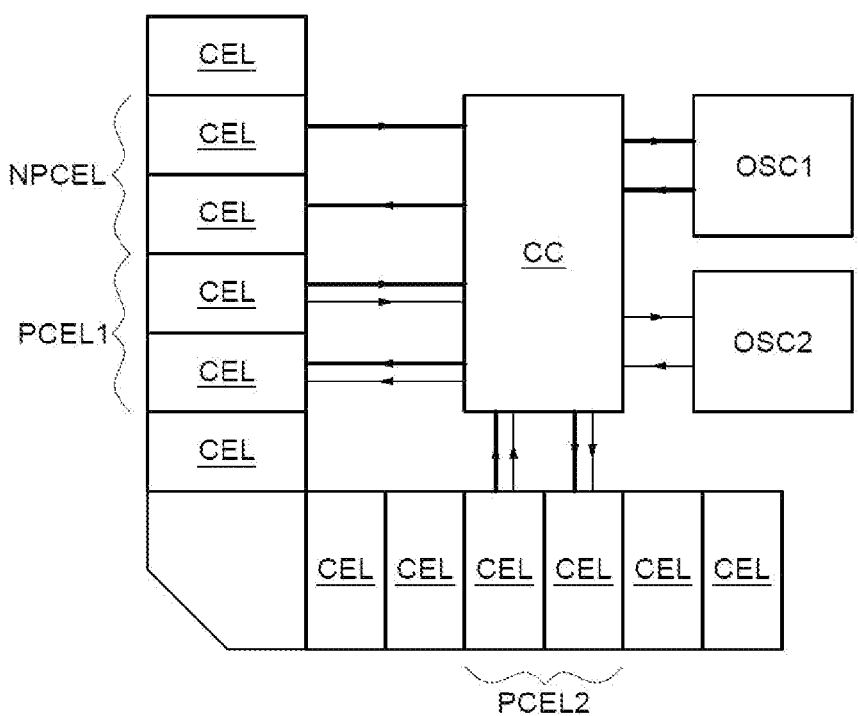
FIG. 2 shows an embodiment of a microcontroller comprising two oscillators.

FIG. 1 shows a microcontroller MIC according to one embodiment comprising two oscillators OSC1, OSC2.

A first oscillator OSC1 may be used as a low-frequency oscillator configured to operate on the basis of an oscillating electrical signal delivered by a low-frequency external resonator RBF. In particular, the first oscillator OSC1 is configured to receive an oscillating electrical signal having a frequency of about 32 kHz and to amplify this oscillating signal.

A second oscillator OSC2 may be used as a high-frequency oscillator configured to operate on the basis of an electrical signal delivered by a high-frequency external resonator RHF. In particular, the second oscillator OSC2 is configured to receive an oscillating electrical signal having a frequency between 4 MHz and 50 MHz and to amplify this oscillating signal.

The external resonators RBF, RHF may be connected to pairs of input/output cells CEL1, CEL2 of the microcontroller.

In FIG. 1, for ease of understanding, just one pair of input/output cells is shown. However, it is possible to envisage a plurality of pairs of input/output cells.

The pair of input/output cells CEL1, CEL2 is configured so as to be able to be connected to a first external resonator and/or to a second external resonator. The first resonator may be a low-frequency resonator RBF capable of delivering an oscillating electrical signal having a frequency of about 32 kHz. The second resonator may be a high-frequency external resonator RHF capable of delivering an oscillating electrical signal having a frequency between 4 MHz and 50 MHz.

The pair of input/output cells CEL1, CEL2 comprises a first input/output cell CEL1 used in the following description as an output to the external resonators RBF, RHF and a second input/output cell CEL2 used in the following description as an input to the oscillators OSC1, OSC2.

Each resonator RBF, RHF may be connected so as to have a first terminal connected to the cell CEL1 and a second terminal connected to the cell CEL2.

In particular, the cell CEL2 comprises a first input PIN1 and a second input PIN2. The cell CEL1 comprises a first output POUT1 and a second output POUT2.

The first resonator may be connected to the first input PIN1 of the cell CEL2 and the first output POUT1 of the cell CEL1.

The second resonator may be connected to the second input PIN2 of the cell CEL2 and the second output POUT2 of the cell CEL1.

The pair of input/output cells CEL1, CEL2 shown in FIG. 1 is said to be shared because it may be connected to two external resonators.

The microcontroller MIC also comprises a switching circuit CC that is electrically connected on one side to the oscillators OSC1, OSC2 and on the other side to the pair of input/output cells CEL1, CEL2. Of course, it is possible to envisage a switching circuit that is configured to be connected to a plurality of pairs of input/output cells, which may or may not be shared.

In the embodiment shown in FIG. 1, the switching circuit CC comprises:

a first input SIN1 configured to receive a signal OSCINLSE from an output of the first oscillator OSC1;

a first output SOUT1 configured to deliver a signal OSCOUTLSE to an input of the first oscillator OSC1;

a second input SIN2 configured to receive a signal OSCINHSE from an output of the second oscillator OSC2; and a second output SOUT2 configured to deliver a signal OSCOUTHSE to an input of the second oscillator OSC2.

The switching circuit also comprises:

a third output SOUT3 connected to the first output POUT1 of the first input/output cell CEL1;

a third input SIN3 connected to the first input PIN1 of the second input/output cell CEL2;

a fourth output SOUT4 connected to the second output POUT2 of the first input/output cell CEL1; and a fourth input SIN4 connected to the second input PIN2 of the second input/output cell CEL2.

The switching circuit further comprises paths, referred to as first primary paths PCP1, PCP2, which are used to connect the first oscillator OSC1 to the output POUT1 and to the input PIN1, respectively.

In particular, the first primary path PCP1 connects the first input SIN1 to the third output SOUT3 through a switch SW1a of the switching circuit CC. The first primary path PCP2 connects the third input SIN3 to the first output SOUT1 through a switch SW2a of the switching circuit CC.

The switching circuit CC further comprises paths, referred to as second primary paths DCP1, DCP2, which are used to connect the second oscillator OSC2 to the output POUT2 and to the input PIN2, respectively.

In particular, the second primary path DCP1 connects the second input SIN2 to the fourth output SOUT4 through a switch SW3a of the switching circuit CC. The second primary path DCP2 connects the fourth input SIN4 to the second output SOUT2 through a switch SW4a of the switching circuit CC.

The switching circuit further comprises paths, referred to as first secondary paths PCS1, PCS2, which are used to connect the first oscillator OSC1 to the output POUT2 and to the input PIN2, respectively.

In particular, the first secondary path PCS1 connects the first input SIN1 to the fourth output SOUT4 through a switch SW1b of the switching circuit CC. The first secondary path PCS2 connects the fourth input SIN4 to the first output SOUT1 through a switch SW2b of the switching circuit CC.

The switching circuit further comprises paths, referred to as second secondary paths DCS1, DCS2, which are used to connect the second oscillator OSC2 to the output POUT1 and to the input PIN1, respectively.

In particular, the second secondary path DCS1 connects the second input SIN2 to the third output SOUT3 through a switch SW3b of the switching circuit CC. The second secondary path DCS2 connects the third input SIN3 to the second output POUT2 through a switch SW4b of the switching circuit CC.

The switching circuit CC further comprises first paths, referred to as first compensation paths PCC1, PCC2, which connect each first secondary path PCS1, PCS2 to the oscillator OSC1 to which this first secondary path PCS1, PCS2 is connected, so as to form a feedback loop.

In particular, the switching circuit comprises a first compensation path PCC1 that couples to the oscillator OSC1 from a node N1 arranged between the switch SW1b of the first secondary output path PCS1 and the output SOUT4.

The switching circuit also comprises a first compensation path PCC2 that couples to the oscillator OSC1 from a node N2 arranged between the switch SW2b of the first secondary output path PCS2 and the input SIN4.

Each first compensation path PCC1, PCC2 further comprises a follower amplifier A1, A2 arranged between the node N1, N2 and the oscillator OSC1, respectively. Thus, the first compensation paths PCC1, PCC2 make it possible to compensate for the distance between the oscillator OSC1 and a resonator when they are connected to one another by the first secondary paths PCS1 and PCS2.

The switching circuit further comprises paths, referred to as second compensation paths DCC1, DCC2, which connect each second secondary path DCS1, DCS2 to the oscillator OSC2 to which this second secondary path DCS1, DCS2 is connected, so as to form a feedback loop.

In particular, the switching circuit comprises a second compensation path DCC1 that couples to the oscillator OSC2 from a node N3 arranged between the switch SW3b of the second secondary output path DCS1 and the output SOUT3.

The switching circuit also comprises a second compensation path DCC2 that couples to the oscillator OSC2 from a node N4 arranged between the switch SW4b of the second secondary output path DCS2 and the input SIN3.

Each second compensation path DCC1, DCC2 further comprises a follower amplifier A3, A4 arranged between the node N3, N4 and the oscillator OSC2, respectively. Thus, the second compensation paths DCC1, DCC2 make it possible to compensate for the distance between the oscillator OSC2 and a resonator when they are connected to one another by the second secondary paths DCS1 and DCS2.

Additionally, the switching circuit CC is configured to be able to withstand a voltage of 5 V.

The microcontroller MIC also comprises a control unit UC circuit that is configured to control the switches SW1a, SW1b, SW2a, SW2b, SW3a, SW3b, SW4a and SW4b of the switching circuit CC. The control unit UC may be a processor.

In particular, the control unit UC circuit is configured:

to connect the first oscillator OSC1 to the input PIN1 and to the output POUT1 of the pair of input/output cells CEL1, CEL2 by closing the switches SW2a and SW1a of the first primary paths PCP2, PCP1, respectively; or to connect the second oscillator OSC2 to the input PIN2 and to the output POUT2 of the pair of input/output cells CEL1, CEL2 by closing the switches SW4a and SW3a of the second primary paths DCP2, DCP1, respectively; or to connect the first oscillator OSC1 to the input PIN2 and to the output POUT2 of the pair of input/output cells CEL1, CEL2 by closing the switches SW2b and SW1b of the first secondary paths PCS2, PCS1, respectively; or to connect the second oscillator OSC2 to the input PIN1 and to the output POUT1 of the pair of input/output cells CEL1, CEL2 by closing the switches SW4b and SW3b of the second secondary paths DCS2, DCS1, respectively.

Generally, an end user will choose to connect either a first resonator, which is intended to operate with the first oscillator OSC1, or a second resonator, which is intended to operate with the second oscillator OSC2, over the pair of input/output cells CEL1, CEL2.

The control unit UC circuit will then be programmed to control the switches SW1a, SW1b, SW2a, SW2b, SW3a, SW3b, SW4a and SW4b of the switching circuit CC according to the input PIN1, PIN2 and to the output POUT1, POUT2 of the pair of input/output cells CEL1, CEL1 to which the resonator will be connected.

Thus, for example, if the user wishes to connect a low-frequency resonator to the input PIN1 and to the output POUT1 of the pair of input/output cells CEL1, CEL2, the control unit UC will be programmed to close the switches SW2a and SW1a so as to connect the first, low-frequency oscillator OSC1 to this low-frequency resonator.

In addition, if the user wishes to connect a low-frequency resonator to the input PIN2 and to the output POUT2 of the pair of input/output cells CEL1, CEL2, the control unit UC will be programmed to close the switches SW2b and SW1b so as to connect the first, low-frequency oscillator OSC1 to this low-frequency resonator.

Similarly, if the user wishes to connect a high-frequency resonator to the input PIN2 and to the output POUT2 of the pair of input/output cells CEL1, CEL2, the control unit UC will be programmed to close the switches SW4a and SW3a so as to connect the second, high-frequency oscillator OSC2 to this high-frequency resonator.

In addition, if the user wishes to connect a high-frequency resonator to the input PIN1 and to the output POUT1 of the pair of input/output cells CEL1, CEL2, the control unit UC will be programmed to close the switches SW4b and SW3b so as to connect the second, high-frequency oscillator OSC2 to this high-frequency resonator.

A bus, for example an n-bit bus, is connected to the oscillators OSC1, OSC2 and to the control unit UC. This bus conveys a control signal, for example an n-bit control signal, allowing the user (using the logic values of the n bits) to indicate the site location of the resonator to the oscillators and to the control unit. On the basis of this information, the control unit UC controls the switches SW1a, SW1b, SW2a, SW2b, SW3a, SW3b, SW4a, SW4b to connect the resonator to the desired oscillator OSC1, OSC2. This oscillator may also adjust its amplification of the signal generated by the resonator according to the site location of the resonator. The amplifiers A1, A2, A3 and A4 are also controlled by the control signal conveyed by the bus.

Such a microcontroller therefore allows an end user to use the same pair of input/output cells to advantageously use two external resonators.

Other embodiments of a microcontroller MIC are shown in FIGS. 2 to 6.

In these embodiments, the microcontroller MIC comprises two oscillators OSC1, OSC2. The oscillator OSC1 is a low-frequency oscillator and the oscillator OSC2 is a high-frequency oscillator.

The microcontroller MIC also comprises a plurality of input/output cells CEL, including an unshared pair NPCEL of input/output cells, a first shared pair PCEL1 of input/output cells and a second shared pair PCEL2 of input/output cells.

The microcontroller MIC also comprises a switching circuit CC that is connected to the two oscillators OSC1, OSC2, to the unshared pair NPCEL of input/output cells and to the two shared pairs PCEL1, PCEL2 of input/output cells.

Such a microcontroller makes it possible to offer greater flexibility in the choices for the design of a circuit board comprising this microcontroller and the external resonators.

Specifically, the user may choose the pair of input/output cells to which to connect a resonator according to a desired site location for resonators on a circuit board comprising the microcontroller.

Figure 3:
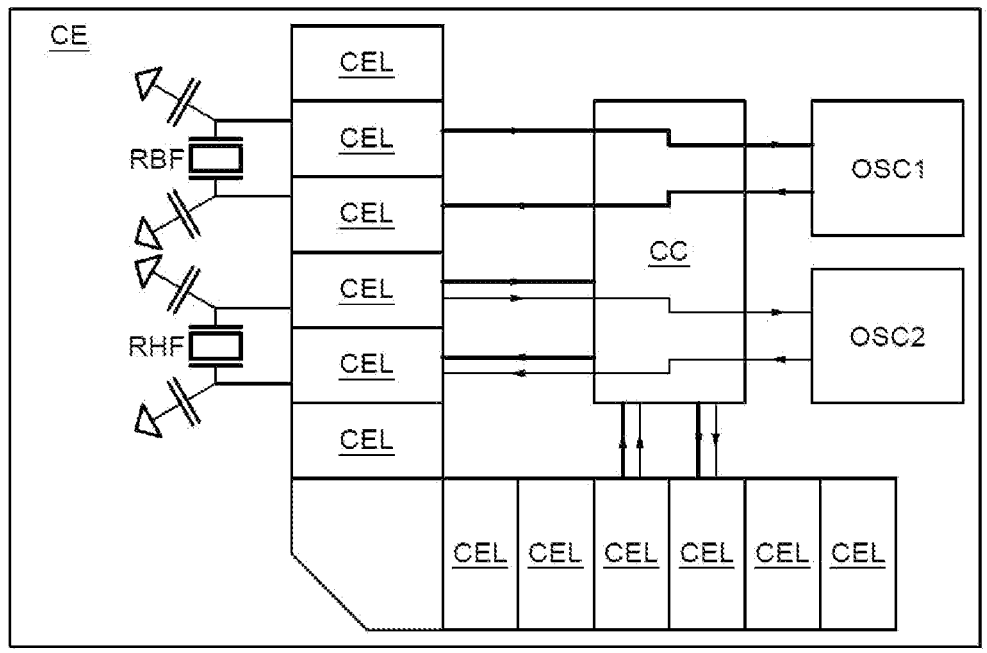
FIGS. 3-6 show various connection configurations for the microcontroller.

In particular, as shown on a circuit board CE in FIG. 3, if the end user wishes to connect a low-frequency resonator RBF over the unshared pair NPCEL of input/output cells and a high-frequency resonator RHF over the shared pair PCEL1 of input/output cells, the control unit UC will be programmed to control the switches of the switching circuit CC so as to connect the low-frequency oscillator OSC1 to the unshared pair NPCEL of input/output cells and to connect the high-frequency oscillator OSC2 to the shared pair PCEL1 of input/output cells.

Figure 4:
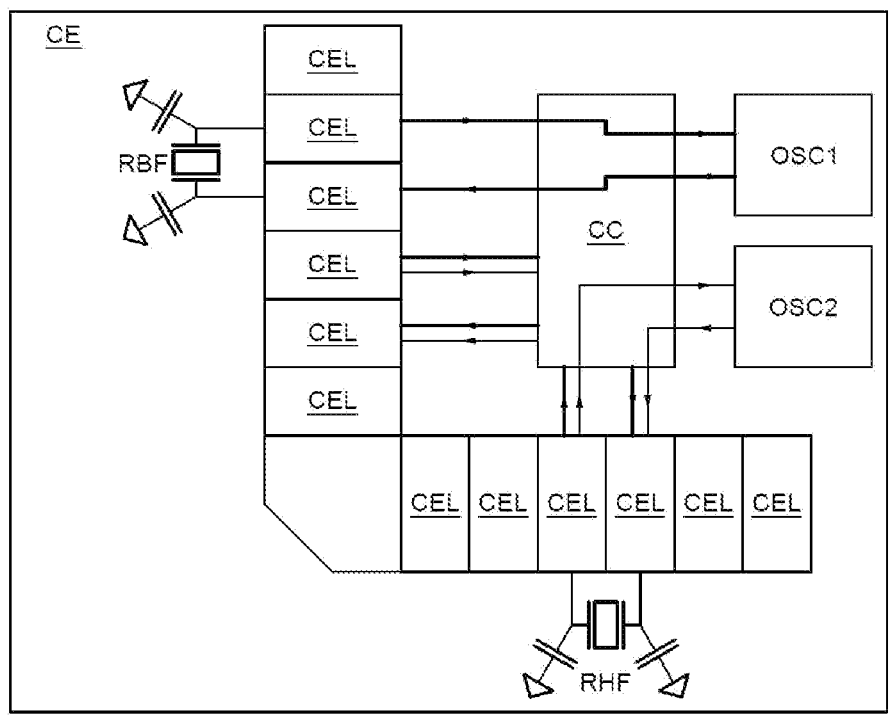

In addition, as shown on a circuit board CE in FIG. 4, if the end user wishes to connect a low-frequency resonator RBF over the unshared pair NPCEL of input/output cells and a high-frequency resonator RHF over the shared pair PCEL2 of input/output cells, the control unit UC will be programmed to control the switches of the switching circuit CC so as to connect the low-frequency oscillator OSC1 to the unshared pair NPCEL of input/output cells and to connect the high-frequency oscillator OSC2 to the shared pair PCEL2 of input/output cells.

Figure 5:
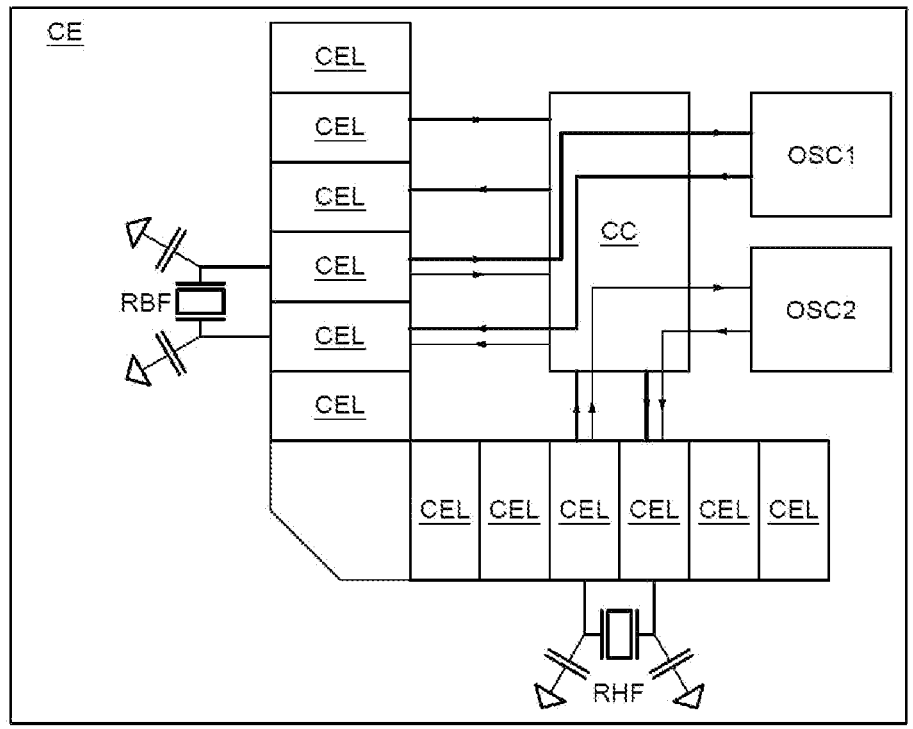

As a variant, as shown on a circuit board CE in FIG. 5, if the end user wishes to connect a low-frequency resonator RBF over the shared pair PCEL1 of input/output cells and a high-frequency resonator RHF over the shared pair PCEL2 of input/output cells, the control unit UC will be programmed to control the switches of the switching circuit CC so as to connect the low-frequency oscillator OSC1 to the pair PCEL1 of input/output cells and to connect the high-frequency oscillator OSC2 to the shared pair PCEL2 of input/output cells.

Figure 6:
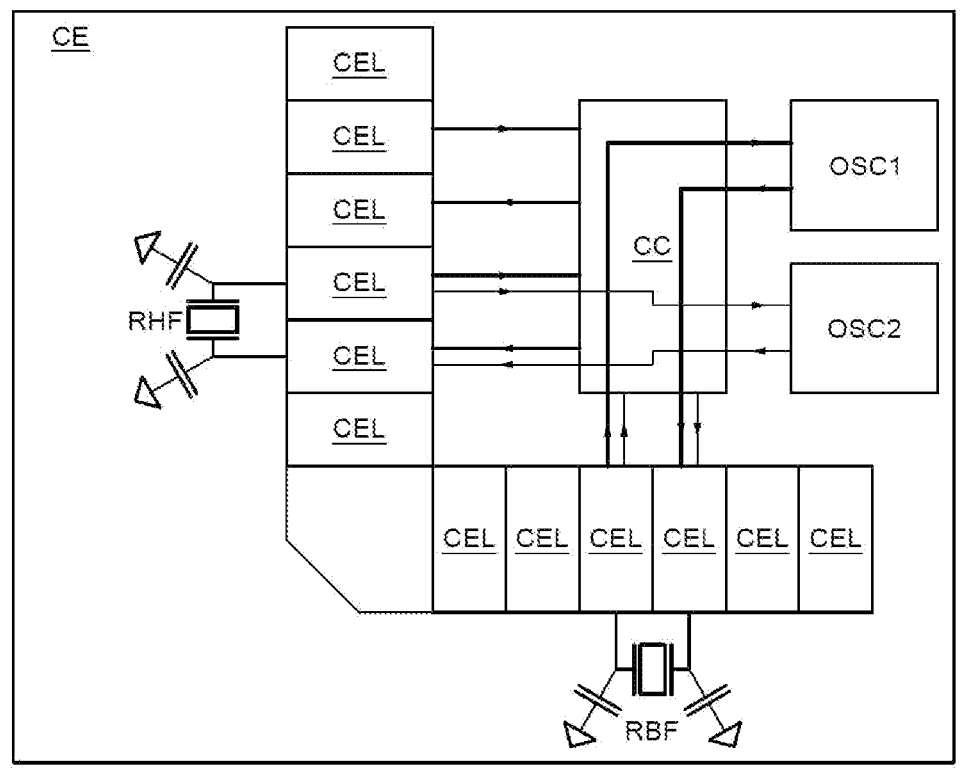

As a variant, as shown on a circuit board CE in FIG. 6, if the end user wishes to connect a low-frequency resonator RBF over the shared pair PCEL2 of input/output cells and a high-frequency resonator RHF over the shared pair PCEL1 of input/output cells, the control unit UC will be programmed to control the switches of the switching circuit CC so as to connect the low-frequency oscillator OSC1 to the unshared pair PCEL2 of input/output cells and to connect the high-frequency oscillator OSC2 to the shared pair PCEL1 of input/output cells.

In these embodiments, those input/output cells which are not used to connect external resonators may be used for other applications.

The invention claimed is:

1. A microcontroller, comprising:
    a plurality of pairs of input/output cells;
    wherein said plurality includes at least one shared pair of input/output cells;
    a first oscillator;
    a second oscillator;
    a switching circuit coupled between said at least one shared pair of input/output cells and the first and second oscillators, wherein the switching circuit is configured to be able to connect either the first oscillator or the second oscillator to the shared pair of input/output cells;
    wherein said shared pair of input/output cells comprises a first pair of pins configured to be connected to a first external resonator in connection with the switching circuit connecting the second oscillator to the first external resonator through the first pair of pins of the shared pair of input/output cells; and
    wherein said shared pair of input/output cells comprises a second pair of pins configured to be connected to a second external resonator in connection with the switching circuit connecting the second oscillator to the second external resonator through the second pair of pins of the shared pair of input/output cells.

2. A microcontroller, comprising:
    a plurality of pairs of input/output cells;
    wherein said plurality includes at least one shared pair of input/output cells;
    a first oscillator;
    a second oscillator;
    a switching circuit coupled between said at least one shared pair of input/output cells and the first and second oscillators, wherein the switching circuit is configured to be able to connect either the first oscillator or the second oscillator to the shared pair of input/output cells;
    wherein said shared pair of input/output cells is configured to be able to be connected to a first external resonator in connection with the switching circuit connecting the second oscillator to the shared pair of input/output cells;

wherein said shared pair of input/output cells is configured to be able to be connected to a second external resonator in connection with the switching circuit connecting the second oscillator to the shared pair of input/output cells; and wherein said at least one shared pair of input/output cells comprises:
- a first cell used as output to the first resonator and the second resonator; and
- a second cell used as input for the first resonator and the second resonator.

3. The microcontroller according to claim 2, wherein, for said at least one shared pair of input/output cells, the switching circuit comprises first primary paths configured for:
- electrically connecting an input of the first oscillator to a first input of the second cell of the shared pair of input/output cells;
- electrically connecting an output of the first oscillator to a first output of the first cell of the shared pair of input/output cells; and
- wherein each first primary path comprises a switch between the first oscillator and the first or second cell to which said first primary path is connected.

4. The microcontroller according to claim 3, wherein, for said at least one shared pair of input/output cells, the switching circuit further comprises second primary paths configured for:
- electrically connecting an input of the second oscillator to a second input of the second cell of the shared pair of input/output cells;
- electrically connecting an output of the second oscillator to a second output of the first cell of the shared pair of input/output cells;
- wherein each second primary path comprises a switch between the second oscillator and the first or second cell to which said second primary path is connected.

5. The microcontroller according to claim 4, wherein, for said at least one shared pair of input/output cells, the switching circuit further comprises first secondary paths configured for:
- electrically connecting the output of the first oscillator to the second output of the first cell of the shared pair of input/output cells;
- electrically connecting the input of the first oscillator to the second input of the second cell of the shared pair of input/output cells;
- wherein each first secondary path comprises a switch between the first oscillator and the first or second cell to which said first secondary path is connected.

6. The microcontroller according to claim 5, wherein, for said at least one shared pair of input/output cells, the switching circuit further comprises first compensation paths which form a feedback loop between the first oscillator and a node arranged between the switch of said first secondary path and the input/output cell to which said first secondary path is connected.

7. The microcontroller according to claim 5, wherein, for said at least one shared pair of input/output cells, the switching circuit further comprises second secondary paths configured for:
- electrically connecting the output of the second oscillator to the first output of the shared pair of input/output cells;
- electrically connecting the input of the second oscillator to the first input of the shared pair of input/output cells; and
- wherein each second secondary path comprises a switch between the second oscillator and the first or second cell to which said second secondary path is connected.

8. The microcontroller according to claim 7, wherein, for said at least one shared pair of input/output cells, the switching circuit further comprises second compensation paths which form a feedback loop between the second oscillator and a node arranged between the switch of said second secondary path and the input/output cell to which said second secondary path is connected.

9. The microcontroller according to claim 2, wherein the first oscillator is configured to receive an oscillating signal having a frequency of about 32 kHz.

10. The microcontroller according to claim 9, wherein the second oscillator is configured to receive an oscillating signal having a frequency between 4 MHz and 50 MHz.

11. The microcontroller according to claim 2, wherein the switching circuit is configured to be able to withstand a voltage of 5 V.

12. The microcontroller according to claim 2, further comprising an external resonator circuit forming said first or second external resonator that is connected to said at least one shared pair of input/output cells of the microcontroller.

13. A microcontroller, comprising:
- an output cell including a first pin for external connection;
- an input cell including a second pin for external connection;
- a first oscillator;
- a second oscillator;
- a switching circuit coupled between the first and second oscillators and the first and second pins of the input cell and the output cell;
- wherein said switching circuit is configured to, in a first switched configuration, selectively connect the first oscillator to the input cell and output cell through the first and second pins and, in a second switched configuration, selectively connect the second oscillator to the input cell and output cell through the first and second pins;
- wherein the first pin of the input cell and the second pin of the output cell are configured to support connection to an external resonator.

14. A microcontroller, comprising:
- an output cell;
- an input cell;
- a first oscillator;
- a second oscillator;
- a switching circuit coupled between the first and second oscillators and the input cell and the output cell;
- wherein said switching circuit is configured to, in a first switched configuration, selectively connect the first oscillator to the input cell and output cell and, in a second switched configuration, selectively connect the second oscillator to the input cell and output cell;
- wherein the input cell and output cell are configured to support connection to an external resonator; and
- wherein the output cell includes a first output node and a second output node, and wherein the switching circuit comprises:
  - a first switched path between an output of the first oscillator and the first output node;
  - a second switched path between the output of the first oscillator and the second output node; and a feedback path between the second output node and a feedback input of the first oscillator.

15. The microcontroller according to claim 14, wherein the feedback path includes an amplifier.

16. A microcontroller, comprising:
an output cell;
an input cell;
a first oscillator;
a second oscillator;
a switching circuit coupled between the first and second oscillators and the input cell and the output cell;
wherein said switching circuit is configured to, in a first switched configuration, selectively connect the first oscillator to the input cell and output cell and, in a second switched configuration, selectively connect the second oscillator to the input cell and output cell;
wherein the input cell and output cell are configured to support connection to an external resonator; and
wherein the input cell includes a first input node and a second input node, and wherein the switching circuit comprises:
a first switched path between an input of the first oscillator and the first input node;
a second switched path between the input of the first oscillator and the second input node; and
a feedback path between the second input node and a feedback input of the first oscillator.

17. The microcontroller according to claim 16, wherein the feedback path includes an amplifier.

18. A microcontroller, comprising:
an output cell;
an input cell;
a first oscillator;
a second oscillator;
a switching circuit coupled between the first and second oscillators and the input cell and the output cell;
wherein said switching circuit is configured to, in a first switched configuration, selectively connect the first oscillator to the input cell and output cell and, in a second switched configuration, selectively connect the second oscillator to the input cell and output cell;
wherein the input cell and output cell are configured to support connection to an external resonator; and
wherein the output cell includes a first output node and a second output node, and wherein the switching circuit comprises:
a first switched path between an output of the second oscillator and the second output node;
a second switched path between the output of the second oscillator and the first output node; and
a feedback path between the first output node and a feedback input of the second oscillator.

19. The microcontroller according to claim 18, wherein the feedback path includes an amplifier.

20. The microcontroller according to claim 18, wherein the input cell includes a first input node and a second input node, and wherein the switching circuit comprises:
a first switched path between an input of the second oscillator and the second input node;
a second switched path between the input of the second oscillator and the first input node; and
a feedback path between the first input node and a feedback input of the second oscillator.

21. The microcontroller according to claim 20, wherein the feedback path includes an amplifier.

22. The microcontroller according to claim 1, wherein the first oscillator is configured to receive an oscillating signal having a frequency of about 32 kHz.

23. The microcontroller according to claim 22, wherein the second oscillator is configured to receive an oscillating signal having a frequency between 4 MHz and 50 MHz.

24. The microcontroller according to claim 1, wherein the switching circuit is configured to be able to withstand a voltage of 5 V.

25. The microcontroller according to claim 1, further comprising an external resonator circuit forming said first or second external resonator that is connected to said at least one shared pair of input/output cells of the microcontroller.

* * * * *